United States Patent
Ding

[11] Patent Number: 6,001,686
[45] Date of Patent: Dec. 14, 1999

[54] METHOD OF FABRICATING A CAPACITOR OVER A BIT LINE OF A DRAM

[75] Inventor: Yen-Lin Ding, Hsinchu, Taiwan

[73] Assignee: United Semiconductor Corp., Taipei, Taiwan

[21] Appl. No.: 09/089,245

[22] Filed: Jun. 2, 1998

[30]  Foreign Application Priority Data

Apr. 28, 1998 [TW] Taiwan .................................. 87106508

[51] Int. Cl.⁶ ................................................ H01L 21/8242
[52] U.S. Cl. ............................................................ 438/253
[58] Field of Search .................................... 438/253, 254, 438/396–99; 257/296, 306

[56]  References Cited

U.S. PATENT DOCUMENTS 5,857,876   5/1998   Jenq ......................................... 438/253

*Primary Examiner*—Charles Bowers
*Assistant Examiner*—Craig Thompson
*Attorney, Agent, or Firm*—Thomas, Kayden, Horstemeyer & Risley

[57]  ABSTRACT

A method of fabricating a capacitor on a bit line of a DRAM. A substrate having a gate, a bit line, a source/drain region and an insulating layer covering the gate and the bit line is provided. A first conductive layer and an oxide layer are formed successively on the insulating layer. The oxide layer and the first conductive layer are defined to form a contact hole to expose the source/drain region. An insulating spacer is formed on the sidewall of the contact hole, and the first conductive layer and the second conductive layer are defined so they may be used as a lower electrode. A dielectric layer is formed on the first conductive layer and the second conductive layer. A third conductive layer as an upper electrode of a capacitor is formed on the dielectric layer.

16 Claims, 3 Drawing Sheets

METHOD OF FABRICATING A CAPACITOR OVER A BIT LINE OF A DRAM

CROSS-REFERENCE TO RELATED APPLICATION

This application claims priority benefit of Taiwan application Serial no. 87106508, filed Apr. 28, 1998, the full disclosure of which is incorporated herein by reference.

BACKGROUND OF THE INVENTION

1. Field of the Invention

The invention relates to a method of fabricating a capacitor of a dynamic random access memory (DRAM), and more particularly to a method of fabricating a capacitor over a bit line (COB) of a DRAM.

2. Description of the Related Art

DRAM is applied broadly in the field of integrated circuits devices, and more importantly, in the electronics industry. DRAMs with higher capacitance are necessary for the development of the industry; as a result, DRAMs with higher density and capacitance are of great interest and are developed by the related industry. How to keep the quality as the size of the device is reduced is now a task for the industry to overcome.

For the storage of digital data, the capacitance of the memory is called a "bit" and the unit for data storage in a memory is called a "memory cell". The memory cell is arranged in array, consisting of columns and rows. A set of a column and a row represents a specific address. Memory cells in the same column or the same row are coupled by a common wiring line, which is called a word line. The vertical wiring line related to data transmittance is called a bit line. The current design of DRAM is composed of a transistor, which is series-coupled to a capacitor to replace the original memory consisting of three transistors. In this manner, the circuit is simplified and the density of the device can be increased.

For the design of Ultra Large Scale Integration (ULSI) DRAM, the lithography and alignment controlling the contact is more and more critical as the device size reduces gradually.

FIG. 1 is a cross sectional view of the conventional COB of DRAM. A substrate 100 with a gate oxide layer 102 formed is provided. A polysilicon layer used as gates 104a, 104b and wiring line 104c is formed and a source/drain region 106a, 106b is then formed on the substrate 100. An insulating layer 108 is next formed to cover the gates 104a, 104b and wiring line 104c. A polysilicon layer is formed and then defined as bit lines 110a, 110b. A planarized oxide layer 112a, 112b is provided on the bit lines 110a, 110b and a contact hole is formed by defining and etching the oxide layer 112b, 112a and the insulating layer 108 to expose the source/drain region 106c. The contact hole is filled with a polysilicon layer 113 to serve as a lower electrode of the capacitor. A dielectric layer 114 is formed on the polysilicon layer 113 and a polysilicon layer 116 is formed on the dielectric layer 114. The polysilicon layer 116 serves as an upper electrode.

As shown in FIG. 1, the etching process becomes more difficult when the device size decreases in order to obey the design rule. The lower electrode 113, the gate 104b and the bit line 110a in FIG. 1 are isolated by insulating layer 108 and oxide layer 112a, 112b. In order to form the contact, the insulating layer 108 and the oxide layer 112a, 112b are etched while the contact hole is defined. The isolation between the lower electrode 113, the gate 104b and the bit lines 110a degrades as the cell size reduces and this affects the device reliability. Also, the difficulty of fabrication which is limited by lithography technology increases.

SUMMARY OF THE INVENTION

It is therefore an object of the invention to increase the width of the contact hole without decreasing the isolation efficiency between the lower electrode of the capacitor, the gate and the bit lines, and without particularly changing the design rule. Consequently, the difficulty in the lithography and etching process of the contact hole is reduced and the process becomes easier. In addition, the capacitance can increase because the surface area of lower electrode increases.

To achieve these objects and advantages, and in accordance with the purpose of the invention, as embodied and broadly described herein, the invention is directed towards a method of fabricating a COB of a DRAM. A substrate having a gate, a bit line, a source/drain region and an insulating layer covering the gate and the bit line is provided. A first conductive layer and an oxide layer are formed successively on the insulating layer. The oxide layer, the first conductive layer and the insulating layer are defined to form a contact hole to expose the source/drain region. An insulating spacer is formed on the sidewall of the contact hole. Then the oxide layer is dipped off and the second conductive layer is formed on the first conductive layer. The first conductive layer and the second conductive layer are defined for use as a lower electrode. A dielectric layer is formed on the first conductive layer and the second conductive layer. A third conductive layer as an upper electrode of a capacitor is formed on the dielectric layer.

It is to be understood that both the foregoing general description and the following detailed description are exemplary and explanatory only and are not restrictive of the invention, as claimed.

DESCRIPTION OF THE PREFERRED EMBODIMENTS

Figure 1:
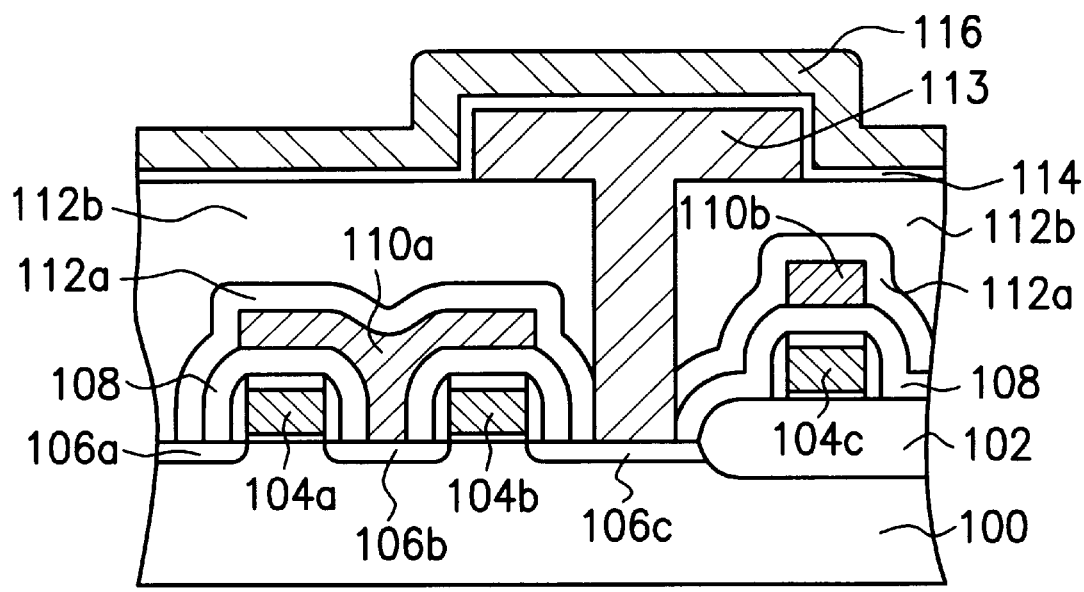
FIG. 1 is a cross sectional structure of a conventional capacitor over a bit line of a DRAM.
Figure 2A:
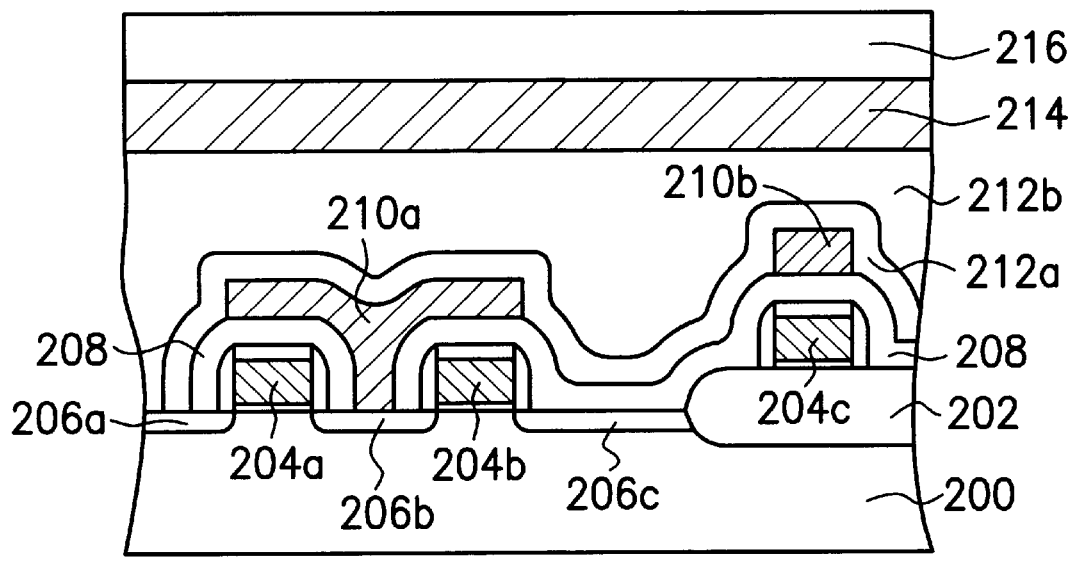
FIG. 2A to FIG. 2E show a process flow of fabricating a capacitor over a bit line of a DRAM in accordance with a preferred embodiment of the invention.

Referring to FIG. 2A, a gate oxide layer 202 is formed on a semiconductor substrate 200, which is, for example, a silicon substrate. Gates 204a, 204b, a wiring line 204c, and source/drain regions 206a, 206b, 206c are next formed on the substrate 200. These gates 204a, 204b and wiring line 204c are isolated from the bit lines 210a, 210b formed in the subsequent process by an oxide layer 208. Bit lines 210a, 210b are formed on the oxide layer 208 and planarized insulating layers 212a, 212b, for example, oxide layers, are formed on the bit lines 210a, 210b. The planarized insulating layer 212a, 212b is planarized by chemical mechanical polish (CMP). A first conductive layer 214 and an oxide layer 216 are formed respectively on the planarized insulating layers 212a, 212b. The first conductive layer includes a doped polysilicon layer.

Figure 2B:
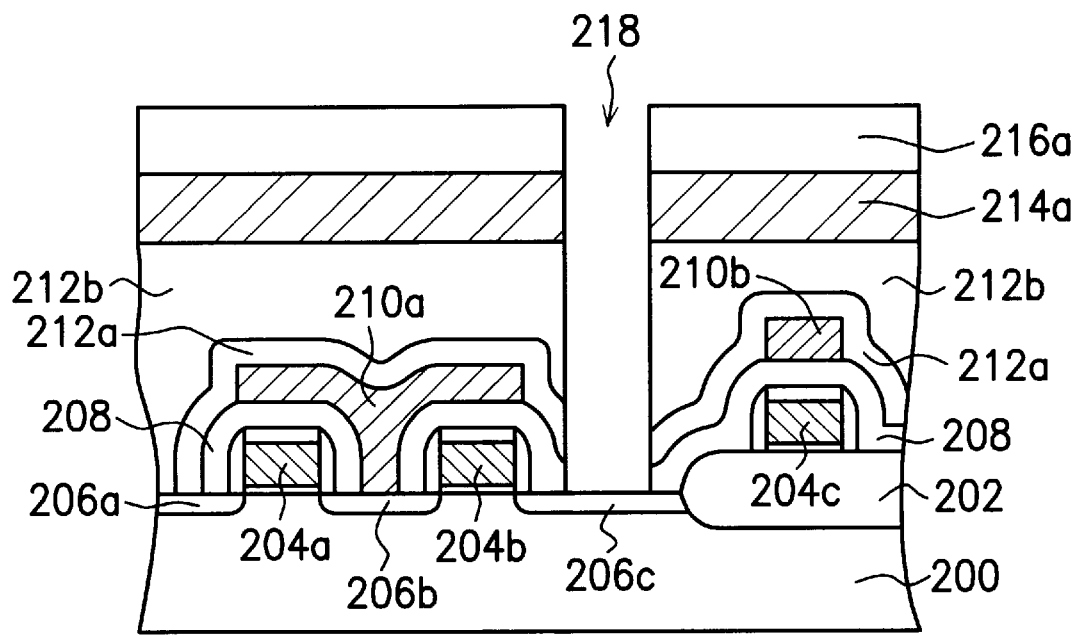

As shown in FIG. 2B, the formation of a contact hole 218 is performed by defining the oxide layer 216a, the first conductive layer 214a, the insulating layer 212b, 212a and the oxide layer 208 by photolithography. A contact hole 218 is then formed by, for example, dry etching to expose the source/drain region 206c.

Figure 2C:
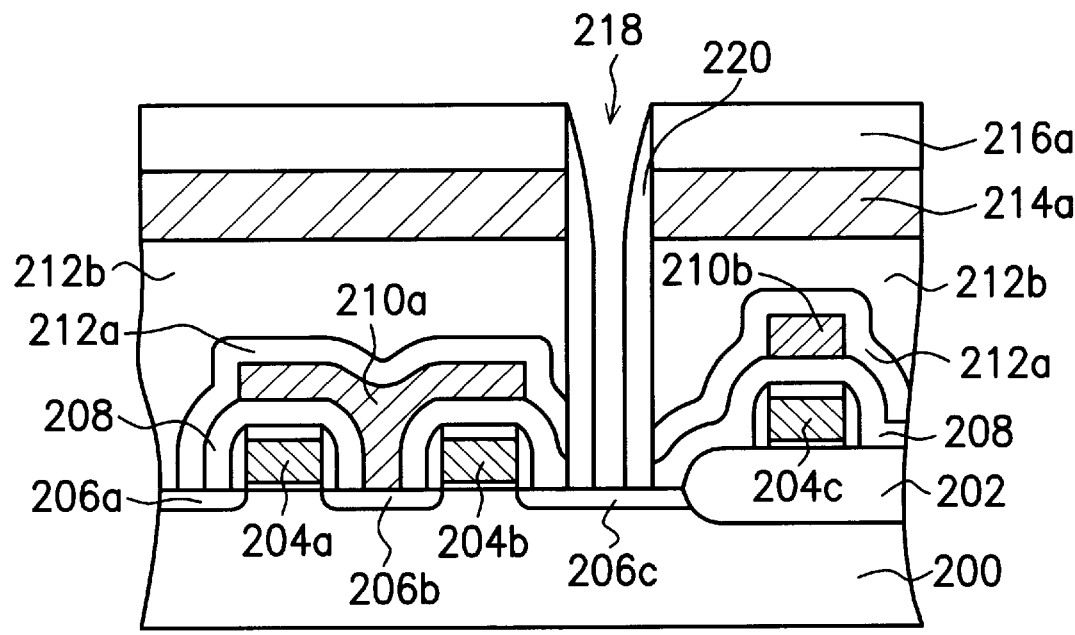

An insulating layer which includes different material from the oxide layer 216a is formed on the surface of the contact hole 218 and the oxide layer 216a. Using the oxide layer 216a as a stop layer, the insulating layer is etched back by dry etching using plasma, and hence an insulating spacer 220 is formed on the sidewall of the contact hole 218 to expose a portion of the source/drain region 206c, as shown in FIG. 2C. The insulating material layer includes silicon nitride. The structure of insulating material spacer 220 has the function of isolating the gate 204b, the bit line 210a and the first conductive layer 214a.

Figure 2D:
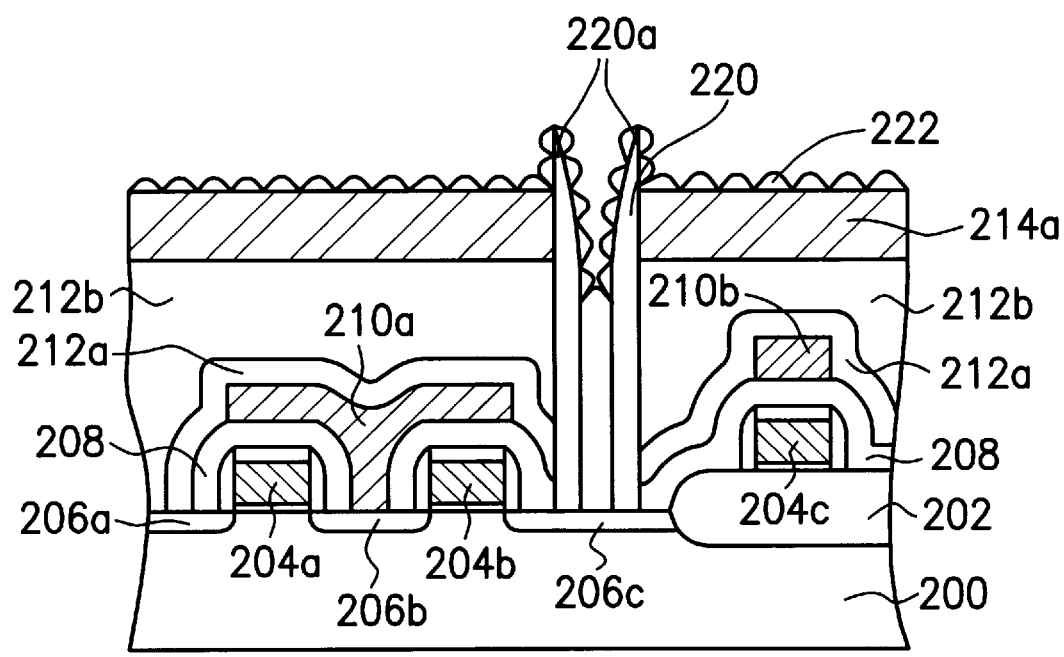

Referring to FIG. 2D, the oxide layer 216a in FIG. 2C is then removed by a process such as by wet etching to expose the surface of the first conductive layer 214a. As a result the angularity 220a of the insulating layer 220 protrudes from the surface of the first conductive layer 214a. Then, a second conductive layer 222 is formed on the surface of the first conductive layer 214a and the insulating spacer 220. The second conductive layer 222 is coupled with a portion of the exposed source/drain region 206c. The second conductive layer 222 includes doped hemi-spherical polysilicon grain (HSG-Si).

Figure 2E:
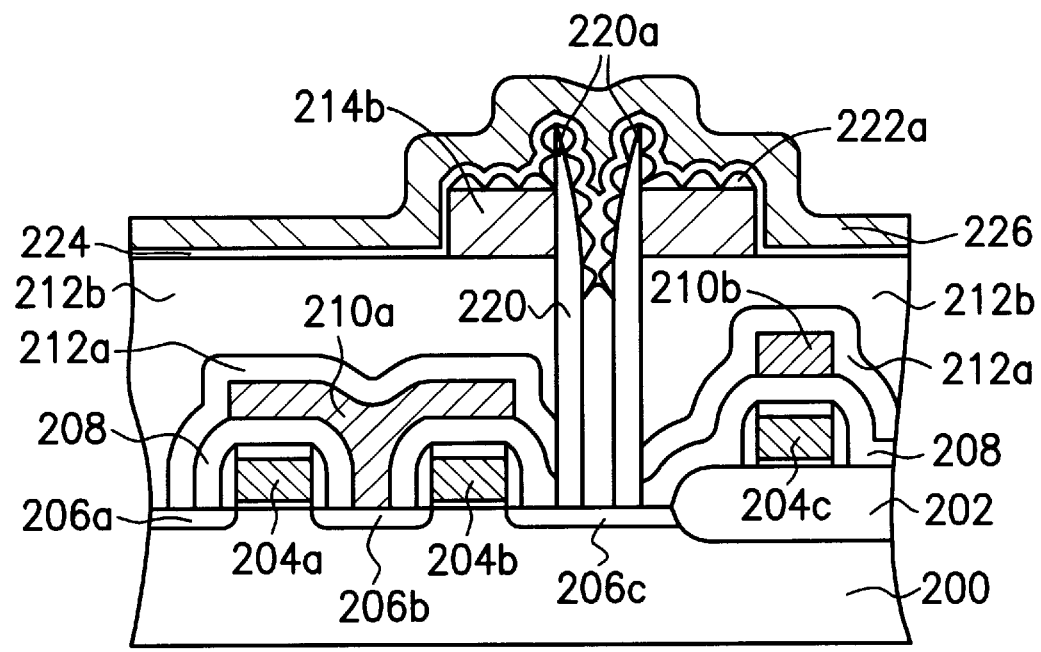

Referring to FIG. 2E, the first conductive layer 214b and the second conductive layer 222a are defined to form a lower electrode of a capacitor. The defined first conductive layer 214 and the second conductive layer 222a is a "inner cylindrical" structure. The surface area can be increased because the angularity 220a of the insulating material layer 220 and the second conductive layer 222a includes the HSG-Si layers. Next, a dielectric layer 224 is formed on the first conductive layer 214b and the second conductive layer 222a. A third conductive layer 226 is formed on the dielectric layer 224 to serve as an upper electrode 224. The third conductive layer preferably contains doped polysilicon.

Therefore, according to the present invention, the formation of the insulating spacer can play a role in isolating the gate, the bit lines and the lower electrode. In addition, the inner cylindrical structure, using the insulating spacer as a body, can increase the surface area of the lower electrode of the capacitor and consequently the capacitance of the capacitor can be enhanced.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a capacitor over a bit line of a DRAM, wherein a substrate having a gate, a bit line and a source/drain region is provided and a planarized insulating layer is formed on the gate and the bit line, comprising:

forming a first conductive layer on the planarized insulating layer;

forming a contact hole to expose the source/drain region by defining the first conductive layer and the planarized insulating layer;

forming an insulating spacer on the sidewall of the contact hole to expose a portion of the source/drain region;

forming a second conductive layer on the insulating spacer and the first conductive layer;

defining the first conductive layer and the second conductive layer to form a lower electrode of the capacitor; and forming a dielectric layer on the first conductive layer and the second conductive layer, and forming a third conductive layer on the dielectric layer to form an upper electrode of the capacitor.

2. The method according to claim 1, wherein said step of forming an insulating spacer on the sidewall of the contact hole further comprises forming an insulating layer on the contact hole and the first conductive layer; and etching back the insulating layer to form an insulating spacer on the sidewall of the contact hole to expose a portion of the source/drain region.

3. The method according to claim 2, wherein the insulating material layer comprises a silicon nitride layer and the insulating spacer is a nitride spacer.

4. The method according to claim 2, wherein said step of etching back the insulating material layer is performed by wet etching.

5. The method according to claim 1, wherein the second conductive layer comprises an Hemi-spherical polysilicon grain (HSG-Si) layer.

6. A method of fabricating a capacitor over bit line of DRAM, wherein a substrate having a gate, a bit line and a source/drain region is provided and a planarized insulating layer is formed on the gate and the bit line, comprising:

forming a first conductive layer and an oxide layer successively on the planarized insulating layer;

forming a contact hole to expose the source/drain region by defining the oxide layer, the first conductive layer and the planarized insulating layer;

forming an insulating spacer on the sidewall of the contact hole to expose a portion of the source/drain region;

forming a second conductive layer on the insulating spacer and the first conductive layer;

removing the oxide layer;

defining the first conductive layer and the second conductive layer to form a lower electrode of the capacitor; and forming a dielectric layer and a third conductive layer successively on the first conductive layer and the second conductive layer, and forming a third conductive layer on the dielectric layer to form an upper electrode of the capacitor.

7. The method according to claim 6, wherein said step of forming an insulating spacer on the sidewall of the contact hole further comprises forming an insulating layer on the contact hole and the first conductive layer; and etching back the insulating layer to form an insulating spacer on the sidewall of the contact hole to expose a portion of the source/drain region.

8. The method according to claim 7, wherein the insulating layer comprises a silicon nitride layer and the insulating spacer is a nitride spacer.

9. The method according to claim 7, wherein said step of etching back the insulating layer is performed by wet etching.

10. The method according to claim 6, wherein the second conductive layer comprises an Hemi-spherical polysilicon grain (HSG-Si) layer.

11. The method according to claim 6, wherein removing the oxide layer is performed by wet etching.

12. The method according to claim 6, wherein the oxide layer comprises doped oxide.

13. The method according to claim 6, wherein the first conductive layer comprises doped polysilicon.

14. The method according to claim 6, wherein the second conductive layer comprises doped polysilicon.

15. The method according to claim 6, wherein the third conductive layer comprises a doped polysilicon layer.

16. The method according to claim 6, wherein the dielectric layer comprises nitride/oxide (NO).

* * * * *